(12) United States Patent
Chen et al.

(10) Patent No.: US 11,230,192 B2
(45) Date of Patent: Jan. 25, 2022

(54) VEHICLE BATTERY MONITORING ASSEMBLY AND MONITORING METHOD

(71) Applicant: Ford Global Technologies, LLC, Dearborn, MI (US)

(72) Inventors: Hanyang B. Chen, Canton, MI (US); Michael J. Irby, Monroe, MI (US)

(73) Assignee: Ford Global Technologies, LLC, Dearborn, MI (US)

(*) Notice: Subject to any disclaimer, the term of this patent is extended or adjusted under 35 U.S.C. 154(b) by 251 days.

(21) Appl. No.: 16/570,380

(22) Filed: Sep. 13, 2019

(65) Prior Publication Data

US 2021/0078409 A1    Mar. 18, 2021

(51) Int. Cl.
| | | |
|---|---|---|
| H02J 7/00 | (2006.01) | |
| B60L 1/00 | (2006.01) | |
| B60R 16/033 | (2006.01) | |
| B60R 16/023 | (2006.01) | |
| G01R 31/382 | (2019.01) | |
| B60K 6/28 | (2007.10) | |

(52) U.S. Cl.
CPC ............ B60L 1/00 (2013.01); B60R 16/0238 (2013.01); B60R 16/033 (2013.01); G01R 31/382 (2019.01); B60K 6/28 (2013.01); B60L 2210/10 (2013.01); B60L 2240/48 (2013.01); B60Y 2200/91 (2013.01); B60Y 2200/92 (2013.01); B60Y 2400/112 (2013.01); H02J 2207/20 (2020.01)

(58) Field of Classification Search
CPC .... B60L 1/00; B60L 2240/48; B60L 2210/10; B60R 16/033; B60R 16/0238; G01R 31/382; H02J 2207/20; B60Y 2400/112; B60Y 2200/91; B60Y 2200/92; B60K 6/28; Y02T 10/70
USPC .............................................. 320/109; 701/22
See application file for complete search history.

(56) References Cited

U.S. PATENT DOCUMENTS

| | | |
|---|---|---|
| 7,336,002 B2 | 2/2008 | Kato et al. |
| 9,413,182 B2 | 8/2016 | Park |
| 9,662,984 B2 | 5/2017 | Park et al. |
| 2001/0019224 A1* | 9/2001 | Amano .................... H02J 9/002 307/10.7 |
| 2016/0250927 A1* | 9/2016 | Wang ...................... B60L 1/003 307/10.1 |

FOREIGN PATENT DOCUMENTS

| | | |
|---|---|---|
| KR | 100534795 | 12/2005 |
| KR | 20170105735 | 9/2017 |

* cited by examiner

*Primary Examiner* — Zixuan Zhou
(74) *Attorney, Agent, or Firm* — David Kelley, Esq.; Carlson, Gaskey & Olds, P.C.

(57) ABSTRACT

A monitoring method includes, among other things, within an electrified vehicle, providing an accessory battery that is configured to power an electrical bus, and a traction battery that is configured to power the electrical bus. The method further includes loading the electrical bus with electrical loads of the electrified vehicle when an amount of power provided to the electrical bus by the traction battery is reduced. After the loading, the method compares an electrical parameter of the accessory battery to a threshold value to assess a condition of the accessory battery.

19 Claims, 2 Drawing Sheets

VEHICLE BATTERY MONITORING ASSEMBLY AND MONITORING METHOD

TECHNICAL FIELD

This disclosure relates to monitoring a battery of a vehicle.

BACKGROUND

Electrified vehicles differ from conventional motor vehicles because electrified vehicles are selectively driven using one or more electric machines powered by a traction battery. Exemplary electrified vehicles include hybrid electric vehicles (HEVs), plug-in hybrid electric vehicles (PHEVs), and battery electric vehicles (BEVs). The electric machines can drive the electrified vehicles instead of, or in addition to, an internal combustion engine. Electrified vehicles can additionally include an accessory battery to power various electrical loads.

SUMMARY

A monitoring method according to an exemplary aspect of the present disclosure includes, among other things, within an electrified vehicle, providing an accessory battery that is configured to power an electrical bus, and a traction battery that is configured to power the electrical bus. The method further includes loading the electrical bus with electrical loads of the electrified vehicle when an amount of power provided to the electrical bus by the traction battery is reduced. After the loading, the method compares an electrical parameter of the accessory battery to a threshold value to assess a condition of the accessory battery.

In another example of the foregoing method, the electrical parameter is a discharge current from the accessory battery.

Another example of any of the foregoing methods includes detecting the discharge current from the accessory battery using a current shunt resistor.

In another example of any of the foregoing methods, loading the electrical bus includes turning on hidden electrical loads of the vehicle.

In another example of any of the foregoing methods, the loading of the electrical bus is at the start of a vehicle drive cycle while the vehicle is in a park gear.

In another example of any of the foregoing methods, the loading of the electrical bus is after keying on the vehicle and prior to placing the vehicle a drive gear.

Another example of any of the foregoing methods includes communicating a message to a user of the vehicle in response to the condition of the accessory battery.

Another example of any of the foregoing methods includes adjusting power sent to the electrical bus from the traction battery with a DC/DC converter, and using the DC/DC converter to reduce the amount of power provided to the electrical bus by the traction battery.

In another example of any of the foregoing methods, the electrical bus is a 12-Volt bus.

In another example of any of the foregoing methods, the output voltage is reduced by at least two volts from a level at which the output voltage is provided to the electrical bus during ordinary operation of the vehicle during a drive cycle.

In another example of any of the foregoing methods, the threshold value is a percentage of a rated maximum power value for the accessory battery. Further, comparing the electrical parameter of the accessory battery to the threshold value to assess the condition of the accessory battery includes assessing whether a measured power value of the accessory battery is below the threshold value.

A monitoring assembly according to another exemplary aspect of the present disclosure includes an accessory battery of a vehicle. The accessory battery is configured to power an electrical bus. At least one sensor is operable to detect an electrical parameter relating to the accessory battery. A converter receives electrical power from a traction battery at an input voltage and provides electrical power to the electrical bus at an output voltage. The output voltage is different than the input voltage. The assembly further includes a controller that commands the converter to provide a reduced output voltage. The controller initiates electrical loading of the electrical bus, and compares an electrical parameter of the accessory battery to a threshold value to assess a condition of the accessory battery.

In another example of the foregoing assembly, the electrical parameter is a discharge current from the accessory battery.

Another example of the foregoing assembly includes a current shunt resistor that detects the discharge current from the accessory battery.

In another example of the foregoing assembly, the electrical bus is electrically loaded by turning on hidden electrical loads of the vehicle.

In another example of the foregoing assembly, the converter is a DC/DC converter.

In another example of the foregoing assembly, the controller commands the converter to provide the reduced output voltage and compares the electrical parameter to the threshold value at the start of a vehicle drive cycle while the vehicle is in a park gear and is stationary.

In another example of the foregoing assembly, the controller commands the converter to provide the reduced output voltage and compares the electrical parameter to the threshold value after keying on the vehicle and prior to placing the vehicle in a drive gear.

The embodiments, examples and alternatives of the preceding paragraphs, the claims, or the following description and drawings, including any of their various aspects or respective individual features, may be taken independently or in any combination. Features described in connection with one embodiment are applicable to all embodiments, unless such features are incompatible.

BRIEF DESCRIPTION OF THE FIGURES

The various features and advantages of the disclosed examples will become apparent to those skilled in the art from the detailed description. The figures that accompany the detailed description can be briefly described as follows.

DETAILED DESCRIPTION

This disclosure details exemplary methods and assemblies utilized to monitor a battery of a vehicle. The embodiments described herein are particularly useful to monitor an accessory battery of an electrified vehicle.

Figure 1:
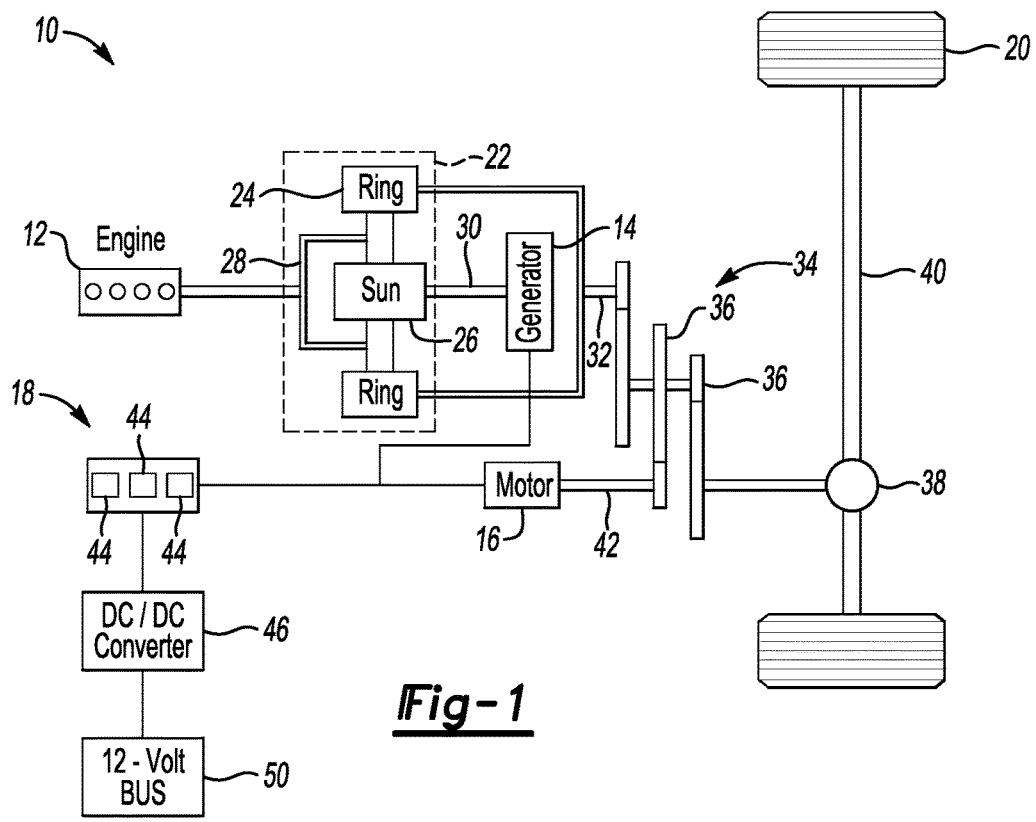
FIG. 1 schematically illustrates portions of a powertrain of an electrified vehicle.

FIG. 1 schematically illustrates selected portions of a powertrain 10 of an electrified vehicle comparing an electrical parameter of the accessory battery to a threshold value to assess a condition of the accessory battery. Although depicted as a hybrid electrified vehicle (HEV), it should be understood that the concepts described herein are not limited to HEVs and could extend to other electrified vehicles, including, but not limited to, plug-in hybrid electrified vehicles (PHEVs), fuel cell vehicles (FCVs), and battery electrified vehicles (BEVs).

In an embodiment, the powertrain 10 is a powersplit powertrain system that employs a first drive system and a second drive system. The first drive system includes a combination of an engine 12 and a generator 14 (i.e., a first electric machine). The second drive system includes at least a motor 16 (i.e., a second electric machine), the generator 14, and at least one traction battery 18. In this example, the second drive system is considered an electric drive system of the powertrain 10. The first and second drive systems generate torque to drive one or more sets of vehicle drive wheels 20 of the electrified vehicle.

The engine 12, which is an internal combustion engine in this example, and the generator 14 may be connected through a power transfer unit 22. In one non-limiting embodiment, the power transfer unit 22 is a planetary gear set that includes a ring gear 24, a sun gear 26, and a carrier assembly 28. Of course, other types of power transfer units, including other gear sets and transmissions, may be used to connect the engine 12 to the generator 14.

The generator 14 can be driven by engine 12 through the power transfer unit 22 to convert kinetic energy to electrical energy. The generator 14 can alternatively function as a motor to convert electrical energy into kinetic energy, thereby outputting torque to a shaft 30 connected to the power transfer unit 22. Because the generator 14 is operatively connected to the engine 12, the speed of the engine 12 can be controlled by the generator 14.

The ring gear 24 of the power transfer unit 22 may be connected to a shaft 32, which is connected to vehicle drive wheels 20 through a second power transfer unit 34. The second power transfer unit 34 may include a gear set having a plurality of gears 36. Other power transfer units may also be suitable. The gears 36 transfer torque from the engine 12 to a differential 38 to ultimately provide traction to the vehicle drive wheels 20. The differential 38 may include a plurality of gears that enable the transfer of torque to the vehicle drive wheels 20. In this example, the second power transfer unit 34 is mechanically coupled to an axle 40 through the differential 38 to distribute torque to the vehicle drive wheels 20.

The motor 16 (i.e., the second electric machine) can also be employed to drive the vehicle drive wheels 20 by outputting torque to a shaft 42 that is also connected to the second power transfer unit 34. In one embodiment, the motor 16 and the generator 14 cooperate as part of a regenerative braking system in which both the motor 16 and the generator 14 can be employed as motors to output torque. For example, the motor 16 and the generator 14 can each output electrical power to the traction battery 18.

The traction battery 18 is an example type of electrified vehicle battery assembly. The traction battery 18 has the form of a high-voltage battery that is capable of outputting electrical power to operate the motor 16 and the generator 14. The traction battery 18 is a traction battery as the traction battery 18 can provides power to drive the vehicle drive wheels 20. In the exemplary embodiment, the traction battery 18 includes a plurality of battery arrays 44. Each of the battery arrays 44 includes a plurality of individual battery cells.

A DC/DC converter 46 can adjust an input voltage of power from the traction battery 18 to a different output voltage. The output voltage can power a 12-Volt bus 50. The input voltage to the DC/DC converter 46 can be 400-Volts, for example. The output voltage from the DC/DC converter 46 can be 13-Volts, for example.

Figure 2:
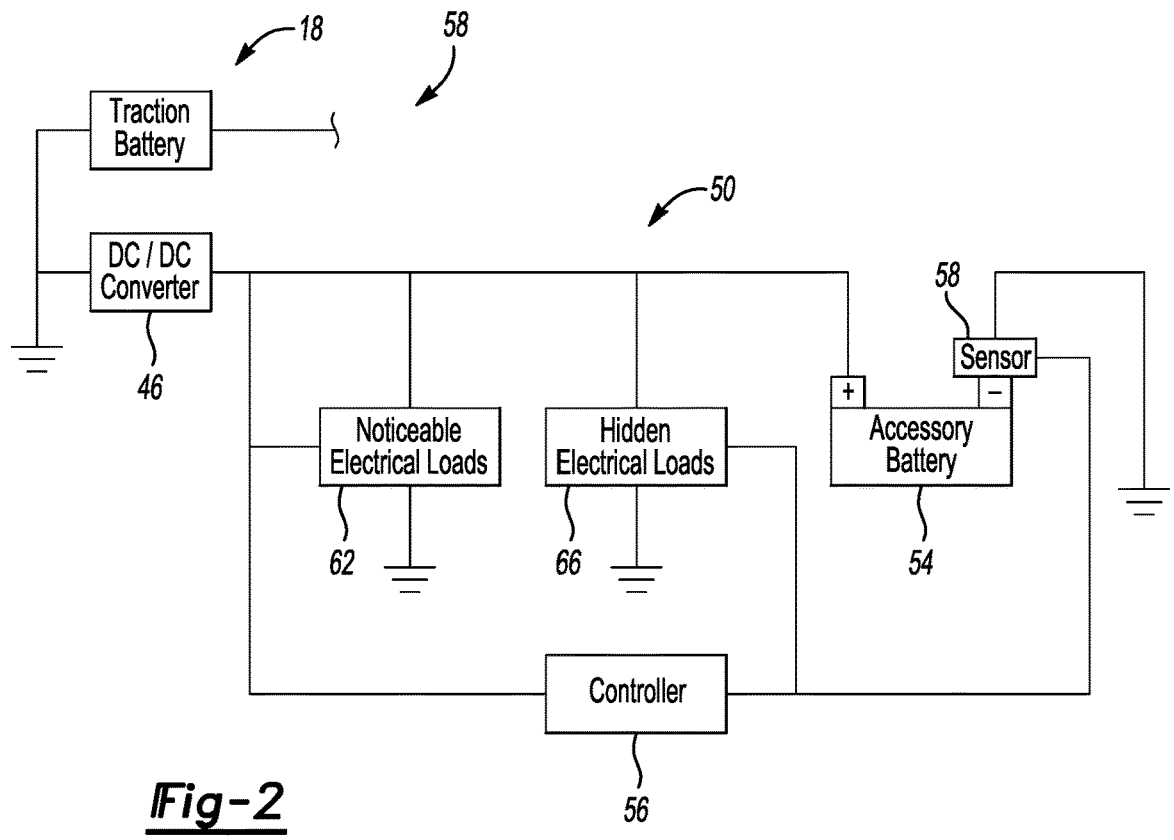
FIG. 2 schematically illustrates an electrical system from the electrified vehicle of FIG. 1.

With reference to FIG. 2 and continued reference to FIG. 1, the vehicle further includes an accessory battery 54 (or auxiliary battery). The accessory battery 54 can be a low-voltage battery, such as a 12-Volt battery. The accessory battery 54 can be a lead-acid battery.

The accessory battery 54 can be used to power various electrical loads of the vehicle. For example, the accessory battery 54 can power key-off loads. Further, while the traction battery 18 typically powers the 12-Volt bus 50 during a drive cycle of the vehicle, the accessory battery 54 can provide supplemental power when the total electrical loads on the 12-Volt bus 50 are higher than a maximum capacity of the DC/DC converter 46. The accessory battery 54 can be relied on to power high transient loads from devices such as electrical power assisted steering, for example.

During normal operation of the vehicle, the output voltage from the DC/DC converter 46 can be set to a value higher than a max voltage that the accessory battery 54, when fully charged, can provide. For example, a typical maximum for a 12-Volt lead-acid battery used vehicles is about 13 Volts. When such a battery is utilized, the DC/DC output voltage in the vehicle can be set between 13.2 to 15.8 Volts. The precise setting can depend, in part, on a temperature of the battery. With this DC/DC output voltage, that accessory battery will have an under charging status during normal operations of the vehicle, and that accessory battery's State of Charge (SOC) status will be close to fully charged.

During typical operation, the 12-Volt bus 50 and the accessory battery 54 are supported by the DC/DC converter 46 with a voltage greater than or equal to 13-Volts. If the DC/DC converter 46 is unable to provide an electrical power to the 12-Volt bus 50, the accessory battery 54 can provide substantially all electrical power to the 12-Volt bus 50.

The exemplary vehicle incorporates a monitoring assembly that can execute a monitoring method for periodically assessing a condition of the accessory battery 54. The monitoring assembly can, for example, assess the condition of the accessory battery 54 by indicating a State Of Health (SOH) of the accessory battery 54. Among other things, assessing the condition of the accessory battery 54 can help a user understand when replacing the accessory battery 54 is required. The condition of the accessory battery 54 can deteriorate over time due to, for example, sulfation, lost active material, lost water, or shorted cells. The assembly and methods described in this disclosure can detect such deteriorated conditions of the accessory battery 54.

Generally, the monitoring assembly detects degradation of the accessory battery 54 by electrically loading the 12-Volt bus 50 while the output voltage from the DC/DC converter 46 is adjusted to a lower level, say 11-Volts. Reduced, for purposes of this disclose means that the output voltage from the DC/DC converter 46 is reduced from the level at which the DC/DC converter 46 typically powers the 12-Volt bus 50 during ordinary operation of the vehicle, here 13-Volts. This results in a relatively large discharge current from the accessory battery 54 when the 12-Volt bus 50 is electrically loaded.

At this time, electrical parameters associated with the discharge current can be compared to threshold values to assess the SOH of the accessory battery 54. The monitoring assembly may implement the degradation detection procedure periodically, every ten days for example. Periodic implementation, rather than more frequent implementation, can conserve energy.

If the comparison indicates that the SOH of the accessory battery 54 has decreased to an undesirable level, the monitoring assembly can broadcast a message to an operator of the vehicle, issue a diagnostic trouble code, or some other indication of the decreased SOH.

The vehicle can include the accessory battery 54 as part of a first electrical system. The vehicle can include the traction battery 18 as part of a second electrical system of the vehicle. The first electrical system and the second electrical system are electrically coupled through the DC/DC converter 46. Again, during typical operation, the DC/DC converter 46 provides an output voltage appropriate for adequately powering 12-Volt bus 50.

The monitoring assembly includes a controller 56 and a sensor assembly 58. The controller 56 is operative coupled to the DC/DC converter 46 and the sensor assembly 58. The sensor assembly 58 can detects an electrical parameter of the accessory battery 54, such as an electrical parameter associated with a discharge current from the accessory battery 54.

To assess the SOH of the accessory battery 54, the controller 56 of the monitoring assembly executes a monitoring method. In the exemplary embodiment, the controller 56 executes the monitoring method with the vehicle is keyed on at the start of a drive cycle when the vehicle is in a park gear.

The monitoring method involves reducing an output voltage from the DC/DC converter 46. Executing the method while the vehicle is in the park gear can avoid issues with reducing power to the 12-Volt Bus 50 when the vehicle is in a drive gear and being driven.

The monitoring method further involves increasing electrically loading on the 12-Volt Bus 50. The controller 56 is operably coupled to various electrical loads of the vehicle. The controller 56 can activate selected electrical loads to increase load the 12-Volt bus 50.

The electrical loads that can be selectively added to the 12-Volt bus 50 include noticeable electrical loads 62 and hidden electrical loads 66. For purposes of this disclosure noticeable electrical loads 62 are electrical loads that, when powered, would be readily noticed or perceived by an operator of the vehicle. Noticeable electrical loads 62 can be, for example, electrical loads associated with powering a radio of the vehicle, a headlight of the vehicle, or dashboard lights within the vehicle.

Exemplary hidden electrical loads 66 are electrical loads that, when powered, would not readily noticed by the operator of the vehicle. Hidden electrical loads 66 can be, for example, electrical loads that power a rear window defroster, a side mirror heater, a washer fluid heater, or an engine coolant fan. As can be appreciated, the operator would more readily perceive a dashboard light being powered than a rear window defroster. The electrical load associated with powering the dashboard light is thus a noticeable electrical load.

In the exemplary embodiment, the controller 56 activates the hidden electrical loads 66 to increase loads on the 12-Volt bus 50 for a short time, say less than two seconds. Activating only the hidden electrical loads 66 can help to hide the monitoring method from the operator. In other examples, other combinations of the hidden electrical loads 66 and noticeable electrical loads 62 could be activated to load the 12-Volt bus 50.

With the output voltage from the DC/DC converter 46 reduced and the 12-Volt bus 50 loaded, the monitoring method collects measurements from the sensor assembly 58 and assesses electrical parameters of the accessory battery 54. The sensor assembly 58 could be a Hall effect sensor or a current shunt resistor, and the electrical parameter could include a discharge current from the accessory battery 54, for example. The controller 56 can receive signals from the sensor assembly 58 indicating the measurements of the electrical parameter.

The method then compares the detected electrical parameter of the accessory battery 54 to one or more threshold values to assess a condition of the accessory battery 54. For example, the electrical parameter could be a discharge current from the accessory battery 54. In such an example, the discharge current detected by the sensor assembly 58 can be compared to a threshold discharge current. If the detected threshold current is less than the threshold discharge current, the condition of the accessory battery 54 could be considered to have degraded such that replacing the accessory battery 54 is recommended.

In another example, based in part on information from the sensor 58, the controller 56 can calculate an internal resistance of the accessory battery 54 based on voltage and current measurements taken by the sensor assembly 58. The capacity of the accessory battery 54 and other SOH parameters can be evaluated based on the internal resistance.

The controller 56 can be relied on to reduce the output voltage from the DC/DC converter 46, to activate the desired electrical loads 62, 66, and to compare the detected electrical parameter to the threshold value.

While schematically illustrated as a single controller, the controller 56 may be part of a larger control system that may be controlled by various other controllers throughout the vehicle, such as a vehicle system controller (VSC) that includes a powertrain control unit, a transmission control unit, and engine control unit, etc. It should therefore be understood that the controller 56 and one or more other controllers can collectively be referred to as a controller that controls, such as through a plurality of interrelated algorithms, the output voltage from the DC/DC converter 46, the electrical loading of the 12-Volt bus 50, the receipt of the electrical parameter from the sensor assembly 58, as well as the comparison of the electrical parameter to a threshold value.

The controller 56 can include a microprocessor or central processing unit (CPU) in communication with various types of computer readable storage devices or media. Computer readable storage devices or media may include volatile and nonvolatile storage and read-only memory (ROM), random-access memory (RAM), and keep-alive memory (KAM), for example. KAM is a persistent or non-volatile memory that may be used to store various operating variables while a CPU of the controller 56 is powered down.

Computer-readable storage devices or media may be implemented using any number of known memory devices, such as PROMS (programmable read-only memory), EPROMS (electrically PROM), EEPROMS (electrically erasable PROM), flash memory, or another electric, magnetic, optical, or combination memory devices capable of storing data some of which represent executable instructions used by the controller 56 to control the output voltage from the DC/DC converter 46, the electrical loading of the 12-Volt bus 50, the receiving of the signal from the sensor assembly 58, and the comparing of the measured electrical parameter to the threshold value.

The controller 56 may communicate with the sensor assembly 58 as well as other various engine/vehicle sensors and actuators via an input/output interface implemented as a single integrated interface that provides various raw data or signal conditioning, processing, and/or conversion, short-circuit protection, and the like. One or more dedicated hardware or firmware chips could be used to condition and process particular signals before being supplied to a CPU of the controller 56.

Although not explicitly illustrated, those of ordinary skill in the art could recognize other various functions or components that may be controlled by the controller 56 within various subsystems of the vehicle.

Control logic of the controller 56 can be implemented in software, hardware, or a combination of software and hardware in one or more specific controllers of the controller 56 depending upon the particular application. When implemented in software, the control logic may be provided in one or more computer-readable storage devices or media having stored data representing code or instructions executed by a computer to control the vehicle or its subsystems. The computer-readable storage devices or media may include one or more of a number of known physical objects which utilize electric, magnetic, and/or optical storage to keep executable instructions and associated operating variables, threshold variables, and the like.

Figure 3:
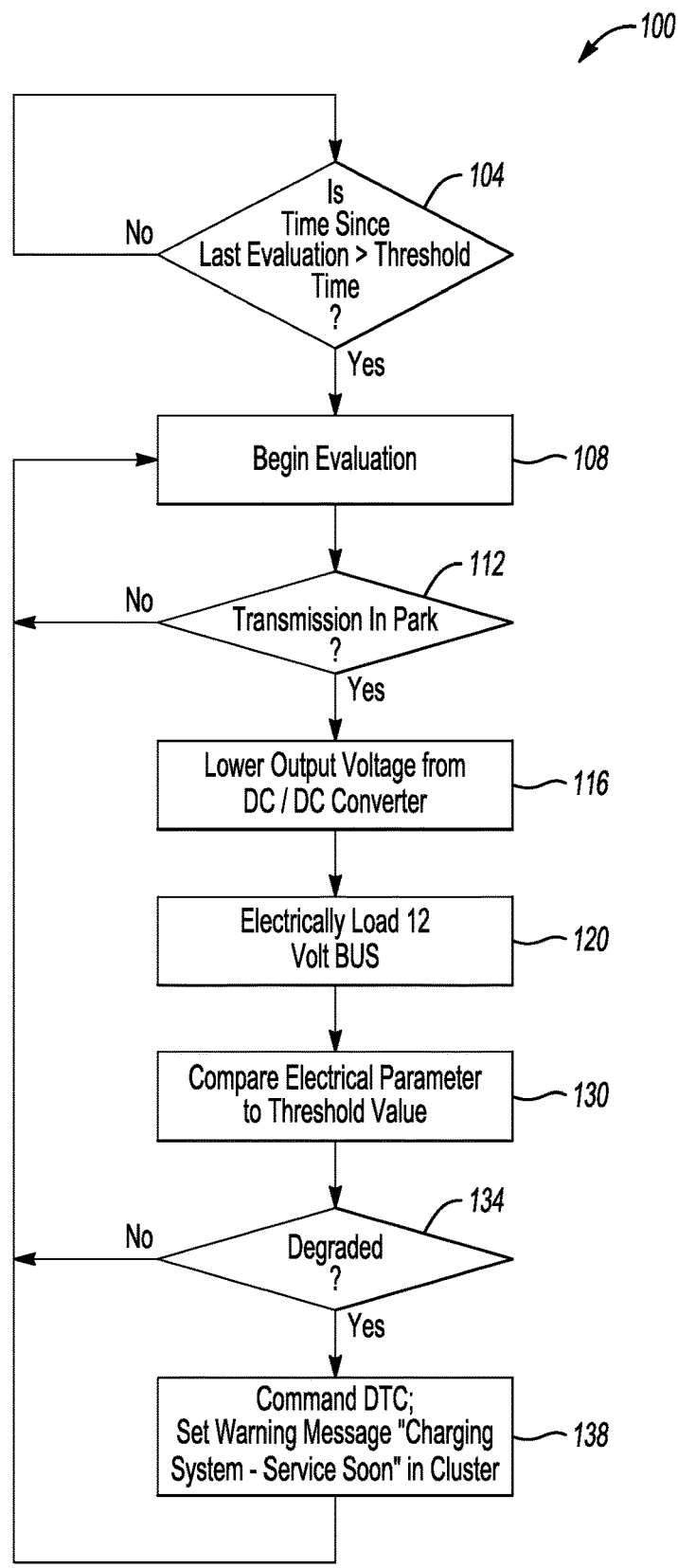
FIG. 3 illustrates a flow of a method of monitoring a battery of the electrified vehicle of FIGS. 1 and 2.

With reference now to FIG. 3, an exemplary monitoring method 100 executed by the controller 56 can begin at a step 104 which assesses whether a time since a last evaluation of the accessory battery 54 is greater than a threshold time. The threshold time is ten days in this example. If the last evaluation of the accessory battery 54 occurred less than ten days ago, the method 100 returns to the step 104.

If the last evaluation of the accessory battery 54 was more than ten days ago, the method 100 moves to a step 108 where an evaluation of the accessory battery 54 begins. In some examples, the threshold time could be adjusted based on an evaluation of the accessory battery 54. For example, if SOH analysis indicated that the accessory battery 54 is trending toward a deteriorated condition, the method 100 may adjust the threshold time so that the method 100 is executed, and the accessory battery 54 evaluated, more frequently, say every three days.

Next, at a step 112, the method 100 assesses whether a transmission of the vehicle is in a parking gear. If not, the method 100 returns to the step 108.

If, at the step 112, the transmission is in a parking gear, the method 100 moves to the step 116, which reduces an output voltage from the DC/DC converter 46 to the 12-Volt bus 50. The method 100 then transitions to a step 120, which electrically loads the 12-Volt bus 50.

In this example, during ordinary operation of the vehicle during a drive cycle, the output voltage from the DC/DC converter is set to 13-Volts. The step 112 reduces the output voltage from 13-Volts to 11-Volts. The output voltage could be reduced to 0-Volts. However, reducing the output voltage to 11-Volts rather than 0-Volts can ensure that the 12-Volt bus 50 will be somewhat powered even if the accessory battery 54 is unable to provide any power to the 12-Volt bus 50. That is, powering the 12-Volt bus 50 with 11-Volts may result in the noticeable electrical loads 62 being only partially powered, but the operator will still notice that the electrical loads 62 are somewhat powered. The headlights, for example, may be dimly lit when powered by 11-Volts. However, the headlights will still be somewhat illuminated.

Next, the method 100 moves to the step 130 which starts the estimating of a capability or SOH of the accessory battery 54. The estimation is based on a comparison of the electrical parameter detected by the sensor assembly 58 with a threshold value. Essentially, at the step 130, the method 100 compares an electrical parameter of the accessory battery 54 to a threshold value to assess a condition of the accessory battery 54.

In the exemplary embodiment, the controller 56 receive an input from the sensor assembly 58 indicating a minimum measured voltage of the accessory battery 54, and another input indicating the highest discharge current measured by the sensor assembly 58. The sensor assembly 58 also measures temperature.

The discharge current can vary as a function of a voltage drop of the accessory battery 54. The threshold value that is compared to the discharge current measured by the sensor assembly 58 can vary based on, among other things, the minimum detected voltage of the accessory battery 54 and temperature.

Table I (below) indicates exemplary relationships between a discharging current as a function of battery voltage and temperature.

TABLE I

|            | −10° C. | 0° C.  | 25° C. | 40° C. |
|------------|---------|--------|--------|--------|
| 12.0-Volts | 23 amps | 25 amps | 32 amps | 36 amps |
| 11.5-Volts | 34 amps | 37 amps | 48 amps | 54 amps |
| 11.0-Volts | 46 amps | 50 amps | 63 amps | 72 amps |
| 10.5-Volts | 57 amps | 62 amps | 79 amps | 89 amps |

With reference to Table I, if, for example, the controller 56 assesses that the voltage of the accessory battery 54 is 11-Volts, and that a temperature of the accessory battery 54 is 0° Celsius, the controller 56 could utilize 50% of 50 amps (i.e., 25 amps) as a first threshold value. The controller 56 would then compare the actual discharge current measured by the sensor assembly 58 to 25 amps. If the actual discharge current is less than 25 amps, the controller 56 would recognize that the condition of the accessory battery 54 may be degraded.

The method 100 makes this comparison at the step 130 and then moves the step 134, which assesses, based on the comparison from the step 130, whether or not the accessory battery 54 has degraded. In the exemplary embodiment, if the actual discharge current measured by the sensor assembly 58 is less than the threshold value, the step 134 considers the accessory battery 54 to have degraded.

As another example, with reference to Table I, the measured current is 48 amps and the temperature of the accessory battery 54 is 25 degrees. The controller 56 at the step 130 can then assess whether the measured battery voltage is less than 11.5 Volts. If the measured battery voltage is less than 11.5 Volts, the accessory battery 54 is considered degraded with its corresponding State of Health (SOH) lower than an expected value.

If the accessory battery 54 is considered degraded at the step 134, the method 100 moves to the step 138. Notably, if the step 134 assesses that the accessory battery 54 has degraded, but during a drive cycle the Electric Power Assisted Steering (EPAS) real-time power is higher than a certain threshold, the DC/DC converter 46 may be degraded rather than the accessory battery 54. In such a condition, at least some of the loads on the 12-Volt bus, such as the hidden electrical loads 66, may be reduced to ensure that the EPAS is adequately powered. Shedding load by reducing the hidden electrical loads 66 can make the load shed less noticeable to the operator. Another alert can then be generated to notify the operator of the potentially degraded DC/DC converter 46.

At the step 138, the controller 56 can command the issuing of a diagnostic trouble code indicating the condition of the accessory battery 54. The method 100 can, at the step 138, further set an alert message within, for example, an instrument cluster of the vehicle. The alert message may indicate that the user should service the accessory battery 54 soon. After the step 138, the method 100 returns to the step 108. The alert could be additionally sent to a personal device, such as a cellular phone, to the cloud, etc. The alert can say "Charging System—Service Soon" if the capacity and max current/power of the accessory battery 54 is less than, say 50%, of a rated value for the accessory battery 54. If the capacity and max current/power of the accessory battery 54 is less than, say 10%, of a rated value for the accessory battery 54, the message may be different. The alert can say "Charging System—Service Now," for example. Thus, the alert can vary based on a detected amount of degradation.

If, at the step 134, the actual threshold current detected by the sensor assembly 94 is not less than the threshold value, the method 100 can, as required, clear any diagnostic trouble code, and any alert message associated with degradation of the accessory battery 54. The method 100 then moves back to the step 104.

It should be understood that the highly schematic depictions shown in the Figures are merely exemplary and is not intended to be limiting on this disclosure. Other configurations are additionally or alternatively contemplated.

Although a specific component relationship is illustrated in the figures of this disclosure, the illustrations are not intended to limit this disclosure. In other words, the placement and orientation of the various components shown could vary within the scope of this disclosure. In addition, the various figures accompanying this disclosure are not necessarily to scale, and some features may be exaggerated or minimized to show certain details of a particular component.

The preceding description is exemplary rather than limiting in nature. Variations and modifications to the disclosed examples may become apparent to those skilled in the art that do not necessarily depart from the essence of this disclosure. Thus, the scope of legal protection given to this disclosure can only be determined by studying the following claims.

What is claimed is:

1. A monitoring method, comprising:
within an electrified vehicle, providing an accessory battery that is configured to power an electrical bus, and a traction battery that is configured to power the electrical bus;
when an amount of power provided to the electrical bus by the traction battery is reduced, loading the electrical bus with electrical loads of the electrified vehicle; and
after the loading, comparing an electrical parameter of the accessory battery to a threshold value to assess a condition of the accessory battery.

2. The monitoring method of claim 1, wherein the electrical parameter is a discharge current from the accessory battery.

3. The monitoring method of claim 2, further comprising detecting the discharge current from the accessory battery using a current shunt resistor.

4. The monitoring method of claim 1, wherein loading the electrical bus includes turning on hidden electrical loads of the vehicle.

5. The monitoring method of claim 1, wherein the loading of the electrical bus is at the start of a vehicle drive cycle while the vehicle is in a park gear and keyed-on.

6. The monitoring method of claim 1, wherein the loading of the electrical bus is after keying on the vehicle and prior to placing the vehicle a drive gear.

7. The monitoring method of claim 1, further comprising communicating a message to a user of the vehicle in response to the condition of the accessory battery.

8. The monitoring method of claim 1, further comprising adjusting power sent to the electrical bus from the traction battery with a DC/DC converter, and using the DC/DC converter to reduce the amount of power provided to the electrical bus by the traction battery.

9. The monitoring method of claim 1, wherein the electrical bus is a 12-Volt bus.

10. The monitoring method of claim 1, wherein the output voltage is reduced by at least two volts from a level at which the output voltage is provided to the electrical bus during ordinary operation of the vehicle during a drive cycle.

11. The monitoring method of claim 1, wherein the threshold value is a percentage of a rated maximum power value for the accessory battery and wherein comparing the electrical parameter of the accessory battery to the threshold value to assess the condition of the accessory battery includes assessing whether a measured power value of the accessory battery is below the threshold value.

12. The monitoring method of claim 1, wherein the loading of the electrical bus with electrical loads of the electrified vehicle occurs when an output voltage from a DC/DC converter is reduced from a level at which the DC/DC converter powers the electrical bus during operation of the electrified vehicle.

13. A monitoring assembly, comprising:
an accessory battery of a vehicle, the accessory battery configured to power an electrical bus;
at least one sensor operable to detect an electrical parameter relating to the accessory battery;
a converter that receives electrical power from a traction battery at an input voltage and provides electrical power to the electrical bus at an output voltage, the output voltage different than the input voltage; and
a controller that, commands the converter to provide an output voltage that is reduced, and compares an electrical parameter of the accessory battery to a threshold value to assess a condition of the accessory battery when the electrical bus is electrically loaded.

14. The monitoring assembly of claim 13, wherein the electrical parameter is a discharge current from the accessory battery.

15. The monitoring assembly of claim 14, further comprising a current shunt resistor that detects the discharge current from the accessory battery.

16. The monitoring assembly of claim 13, wherein the electrical bus is electrically loaded by turning on hidden electrical loads of the vehicle.

17. The monitoring assembly of claim 13, wherein the converter is a DC/DC converter.

18. The monitoring assembly of claim 17, wherein the controller commands the converter to reduce the output voltage and compares the electrical parameter to the threshold value at the start of a vehicle drive cycle while the vehicle is in a park gear and keyed-off.

19. The monitoring assembly of claim 13, the controller commands the converter to reduce the output voltage and compares the electrical parameter to the threshold value after keying on the vehicle and prior to placing the vehicle in a drive gear.

\* \* \* \* \*